United States Patent
We et al.

(10) Patent No.: US 9,502,490 B2
(45) Date of Patent: Nov. 22, 2016

(54) EMBEDDED PACKAGE SUBSTRATE CAPACITOR

(71) Applicant: QUALCOMM Incorporated, San Diego, CA (US)

(72) Inventors: Hong Bok We, San Diego, CA (US); Kyu-Pyung Hwang, San Diego, CA (US); Young Kyu Song, San Diego, CA (US); Dong Wook Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 79 days.

(21) Appl. No.: 14/283,980

(22) Filed: May 21, 2014

(65) Prior Publication Data

US 2015/0340425 A1 Nov. 26, 2015

(51) Int. Cl.
| | |
|---|---|
| *H01L 49/02* | (2006.01) |
| *H01L 23/498* | (2006.01) |
| *H05K 1/18* | (2006.01) |
| *H05K 3/46* | (2006.01) |
| *H01L 23/50* | (2006.01) |

(52) U.S. Cl.
CPC ......... *H01L 28/40* (2013.01); *H01L 23/49822* (2013.01); *H01L 23/49827* (2013.01); *H01L 23/50* (2013.01); *H05K 1/185* (2013.01); *H05K 3/4602* (2013.01); *H01L 2224/131* (2013.01); *H01L 2224/13147* (2013.01); *H01L 2224/16227* (2013.01); *H01L 2924/15311* (2013.01)

(58) Field of Classification Search
CPC .............. H01L 28/40; H01L 23/49827; H01L 23/49822; H01L 23/50; H01L 2924/15311; H01L 2224/16227; H01L 2224/131; H01L 2224/13147; H01L 2924/014; H05K 1/185; H05K 3/4602

USPC .......................................... 257/532; 438/121
See application file for complete search history.

(56) References Cited

U.S. PATENT DOCUMENTS

| | | | |
|---|---|---|---|
| 6,888,218 B2 | 5/2005 | Kling et al. | |
| 7,504,706 B2 | 3/2009 | Swaminathan et al. | |
| 7,548,432 B2 | 6/2009 | Lu et al. | |
| 8,289,725 B2 | 10/2012 | Fan | |
| 2004/0027813 A1 | 2/2004 | Li | |
| 2004/0256717 A1 | 12/2004 | Suenaga et al. | |
| 2006/0145331 A1 | 7/2006 | Cho et al. | |
| 2011/0018099 A1 | 1/2011 | Muramatsu | |
| 2015/0116964 A1 | 4/2015 | Noda | |

FOREIGN PATENT DOCUMENTS

| | | |
|---|---|---|
| EP | 1137332 A1 | 9/2001 |
| WO | 2014007129 A1 | 1/2014 |

OTHER PUBLICATIONS

International Search Report and Written Opinion—PCT/US2015/031394—ISA/EPO—Aug. 20, 2015.

*Primary Examiner* — Hrayr A Sayadian
(74) *Attorney, Agent, or Firm* — Muncy, Geissler, Olds & Lowe, P.C.

(57) ABSTRACT

A package substrate is provided that includes a core substrate and a capacitor embedded in the core substrate including a first side. The capacitor includes a first electrode and a second electrode disposed at opposite ends of the capacitor. The package also includes a first power supply metal plate extending laterally in the core substrate. The first power supply metal plate is disposed directly on the first electrode of the capacitor from the first side of the core substrate. A first via extending perpendicular to the first metal plate and connected to the first power supply metal plate from the first side of the core substrate.

14 Claims, 8 Drawing Sheets

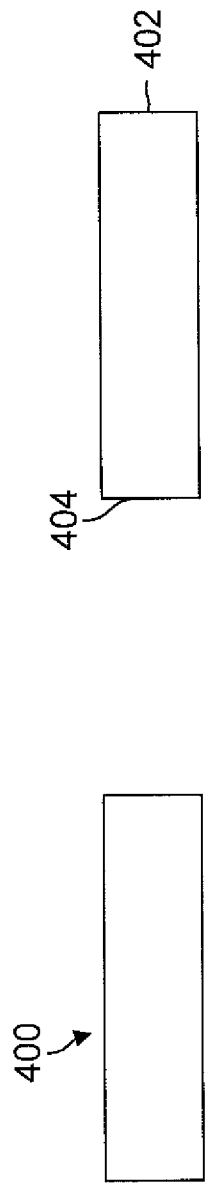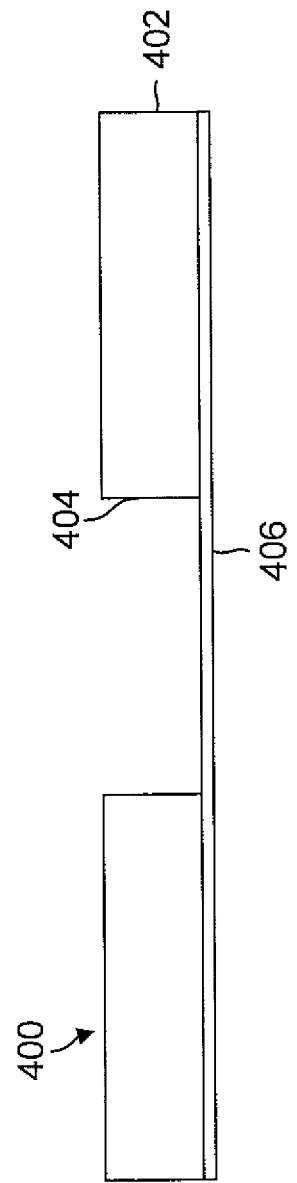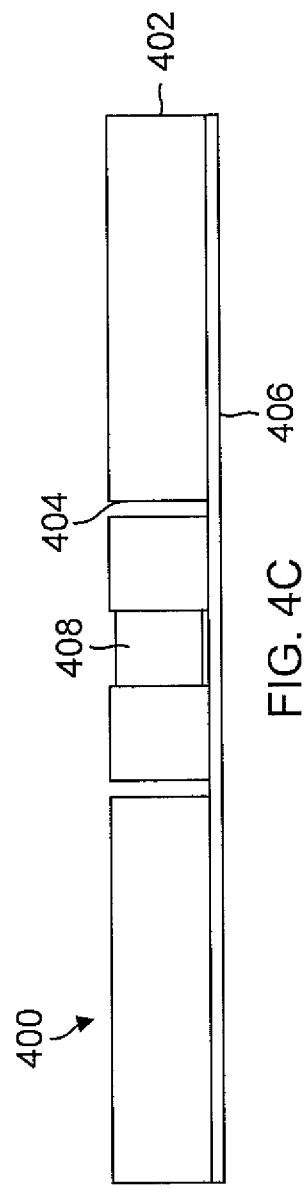

EMBEDDED PACKAGE SUBSTRATE CAPACITOR

TECHNICAL FIELD

This application relates to Embedded Package Substrate (EPS) capacitors for an integrated circuit, and more particularly, to EPS capacitors buried in package power and ground planes.

BACKGROUND

Decoupling capacitors have traditionally been located in close proximity to an integrated circuit to provide instantaneous current to the integrated circuit. For example, a digital circuit, such as a microprocessor, includes numerous transistors that alternate between dormant and switching states. Such digital circuits thus make abrupt current demands when a large number of transistors switch states. Decoupling capacitors may provide additional power to these digital circuits when needed and may recharge at a later time when power demand subsides. A power supply, such as a switching power supply, cannot accommodate the abrupt power demands from the digital circuits. The decoupling capacitor helps support the power supply voltage delivered to the digital circuits. Without a decoupling capacitor, the power supply voltage to the digital circuits would then sag unacceptably during abrupt power demands by the microprocessor. But the decoupling capacitor can supply such instantaneous power demands. In this sense, the decoupling capacitor decouples the power supply from the abrupt power demands from the digital circuits.

As the clocking rates increase, the effectiveness of a decoupling capacitor depends on more than just its capacitance. For example, a decoupling capacitor may have a relatively large amount of capacitance yet offer poor decoupling performance in the higher frequency regimes if the decoupling capacitor has unacceptably high amounts of parasitic inductance and resistance with respect to its coupling to the digital circuits it helps power. Indeed, a decoupling capacitor could have infinite capacitance yet offer poor performance in the higher frequency regimes if it also has significant parasitic inductance and resistance. This parasitic inductance and resistance depends upon a number of factors, including the distance between the decoupling capacitor and the digital circuits it helps power. To minimize this distance, the decoupling capacitor could be integrated into the die. But such integration onto the die uses expensive die real estate. An alternative is to mount the decoupling capacitor on the circuit board but then the separation between the decoupling capacitor and the die is too large such that there is then too much parasitic inductance and resistance. It is thus often preferable to use an embedded package substrate (EPS) capacitor as the decoupling capacitor. The EPS capacitor, as implied by its name, is embedded in the package substrate and is thus relatively close to the associated die on the package substrate. In this fashion, EPS capacitors offer attractively low levels of parasitic inductance and resistance compared to locating the decoupling capacitor on the board. Moreover, EPS capacitors are less expensive as compared to integrating the decoupling capacitor into the die.

EPS capacitors are embedded into the package substrate by first cutting a hole in a core substrate to form a cavity and then securing the EPS capacitor in the package substrate cavity with adhesive. The remainder of the cavity may then be filled with dielectric material. One or more substrate package metal layers may then be deposited over the EPS capacitor. Vias form electrical connections between the overlaying package substrate metal layer(s) and the EPS capacitor. An example conventional package substrate 100 is shown in FIG. 1 with an EPS capacitor 150. EPS capacitor 150 includes a positive electrode 152 and a ground electrode 154 at which electrical power of the EPS capacitor 150 may be accessed.

An M1 metal layer 160 overlays EPS capacitor 150. Via 116 forms the electrical connections between M1 metal layer 160 and positive electrode 152. Similarly, via 118 form the electrical connections between M1 metal layer 160 and negative electrode 154. For illustration clarity, positive electrode 152 is shown coupling to just one via 116. However, multiple vias 116 may couple to positive electrode 152. The number of vias 116 coupling to positive electrode 152 is limited by the footprint for electrode 152 and the required pitch or spacing between adjacent vias 116. A similar limitation exists for the number and location of vias 118 for negative electrode 154. These limitations on the number and distribution of vias 116 and 118 adversely affect the parasitic inductance and resistance for EPS capacitor 150. For example, the footprints for positive electrode 152 is relatively small such that only a relatively small number of vias 116 may couple to it as limited by the required pitch between vias 116. The number of vias 118 are limited analogously. Each via 116 and 118 must then carry a relatively large amount of current, which increases the parasitic inductance. Moreover, because vias 116 and 118 are limited to the footprints for electrodes 152 and 154, the routing flexibility in M1 metal layer 5 160 is reduced accordingly.

Accordingly, there is a need for semiconductor package substrates with embedded capacitors having reduced parasitic inductance and resistance and increased routing flexibility.

SUMMARY

To provide reduced parasitic inductance and resistance, a package substrate is provided that includes a capacitor embedded in a cavity in the package substrate. The capacitor includes at least a first electrode and a second electrode. The substrate includes at least a first metal layer and an underlying second metal layer. The second metal layer includes a first metal plate disposed on and extending laterally from the first electrode of the capacitor from a first side of the core substrate. The second metal layer may also include a second metal plate disposed on and extending laterally from the second electrode of the capacitor.

The first and second metal plates are quite advantageous with regard to the number of and placement of vias between the first metal layer of the substrate and the first and second metal plates. In particular, because the first metal plate laterally extends from the first electrodes on the capacitor, the locations for the vias the couple between the first metal plate and the first metal layer are not limited to the electrode footprints. In contrast, the location for vias such as vias 116 and 118 in conventional EPS capacitor 105 was limited by the footprint or surface area for the respective electrodes 152 and 154.

Given their lateral extension from their respective electrodes, the first and second metal plates disclosed herein offer a significantly larger footprint or surface area as compared to the electrode footprints. The first and second metal plates may thus support more vias as compared to conventional package substrates with EPS capacitors. Each via may thus carry less current and thus have less parasitic inductance as compared to the more limited number of vias and thus higher current density in conventional approaches. In addition, the larger footprint for the first and second metal plates offers enhanced flexibility with regard to locating the vias that couple between the first and second metal plates and the first metal layer. These and other advantageous features may be better appreciated by the following detailed description.

DRAWINGS

Various features, nature and advantages may become apparent from the detailed description set forth below when taken in conjunction with the drawings in which like reference characters identify correspondingly throughout.

FIGS. 4A-4I illustrate a sequence for providing/manufacturing a package substrate embedded with an EPS capacitor in accordance with an embodiment of the present disclosure.

DETAILED DESCRIPTION

Figure 1:
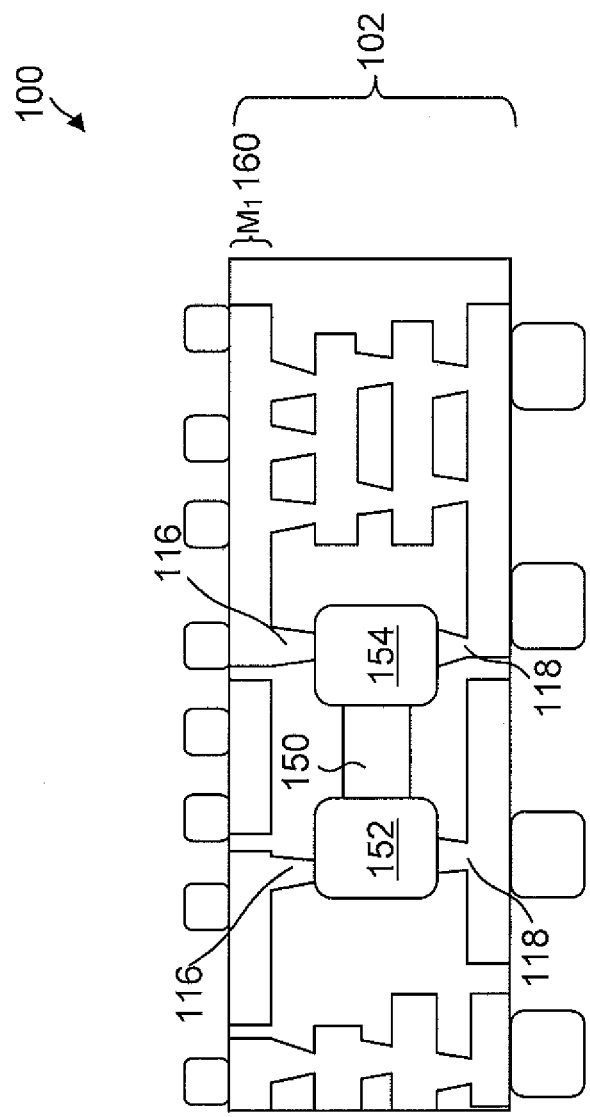
FIG. 1 is a cross-sectional view of a package substrate with an embedded package substrate (EPS) capacitor in accordance with the prior art.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

A package substrate is provided that includes an EPS capacitor embedded in a cavity in the core substrate. The EPS capacitor includes at least one positive electrode and at least one negative electrode. In one embodiment, the positive and negative electrodes may be disposed at opposite ends of the capacitor. More generally, the EPS capacitor has at least a first electrode and a second electrode. The first and second electrodes each have a first surface and an opposing second surface. The package substrate includes at least a first metal layer (M1) and an underlying second metal layer (M2). Both the M1 metal layer and the M2 metal layer overlay the EPS capacitor. The M2 metal layer includes a first metal plate disposed on the first surface of the first electrode and also extending laterally from the first electrode in the package substrate. At least one first via extends perpendicularly from the first metal plate in the M2 metal layer to couple to the M1 metal layer.

The M3 metal layer and the M4 metal layer both underlay the EPS capacitor. The M3 metal layer may include a second metal plate disposed on the second surface of the second electrode and extending laterally from the second electrode. The second metal plate includes a least one second via extending from the second metal plate to the fourth metal layer. The following discussion will be directed to embodiments with a plurality of first and second vias without loss of generality.

Because of the lateral extension of the first metal plate from the first electrode, the first metal plate has a larger footprint or surface area as compared to the footprint for the first electrode. There is thus a portion of the footprint for the first metal plate that does not overlap with the footprint for the first electrode. One or more of the first vias may be located in this non-overlapping portion of the first metal plate's footprint. As such, there is no keep-out area as defined by the first electrode's footprint in the M1 metal layer of the package substrate. In contrast, prior art package substrates with EPS capacitors such as package substrate 100 discussed with regard to FIG. 1 must reserve a corresponding footprint in the M1 metal layer for coupling to the EPS vias. But in the present disclosure, there is routing flexibility in that the first vias are not restricted to the first electrode footprint. If necessary, other routing structures may thus be placed in the first electrode footprint on the M1 metal layer since the first vias may be distributed into the non-overlapping portion of the footprint for the first metal plate.

In addition, the number of first vias is only limited by the first metal plate footprint. Since this footprint is larger than the first electrode footprint, the number of first vias in the present disclosure may be significantly greater than whatever number of vias could be accommodated for coupling to the positive electrode in prior art embedded capacitor architectures. This greater number means that the current density in each first via is decreased with respect to the current density for a comparable delivery of charge for the corresponding positive electrode vias in conventional architectures. This reduced current density provides reduces parasitic inductance. Moreover, the greater number of vias plainly leads to a reduced parasitic resistance as compared to conducting the same amount of charge through the smaller number of vias in prior art architectures.

The M2 metal layer may include an analogous second metal plate disposed on the second electrode of the EPS capacitor and extending laterally from the second electrode. A plurality of second vias may then couple between the second metal plate and the M1 metal layer to provide analogous routing flexibility and reduced parasitic inductance and resistance as compared to prior art architectures. These advantageous features may be better appreciated with regard to the following example embodiments.

Example Embodiments

Figure 2:
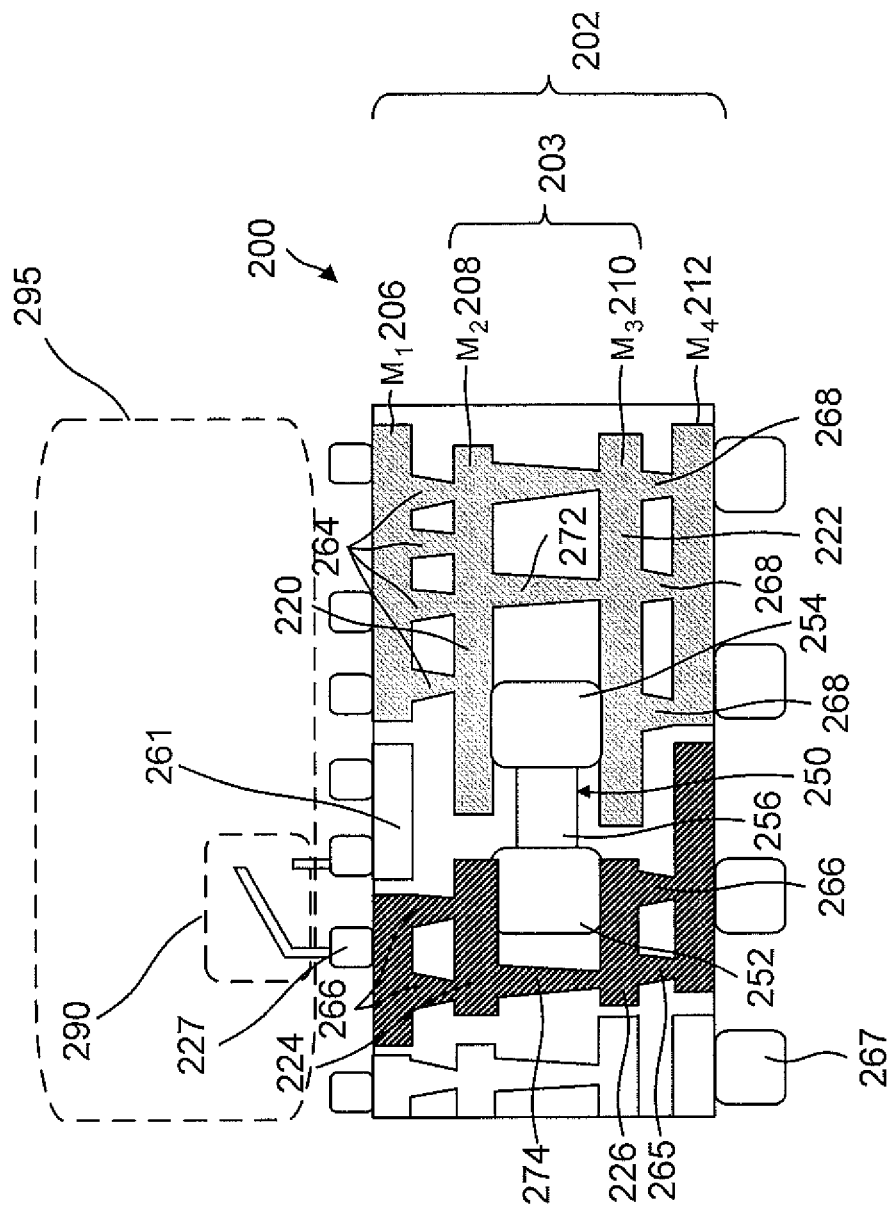
FIG. 2 is a cross-sectional view of a package substrate with an EPS capacitor in accordance with an embodiment of the present disclosure.

FIG. 2 shows an example integrated circuit package 200 including a package substrate 202 and an EPS capacitor 250. The package substrate 202 includes a plurality of metal layers, such as an M1 metal layer 206, an M2 metal layer 208, an M3 metal layer 210, and an M4 metal layer 212 that are separated by corresponding layers of dielectric material. Although four metal layers are illustrated, it should be understood that there may be more or less metal layers. The metal layers may be formed with copper, nickel, or other suitable metals for electrical conduction, such as silver or gold. The package substrate 202 may comprise a laminated organic substrate, a glass substrate, or a semiconductor substrate.

The EPS capacitor 250 is disposed or embedded in a core 203 of package substrate 202. For example, a cavity may be formed in the core 203 to accommodate the EPS capacitor

250. The EPS capacitor 250 may comprise a Multi-Layer Ceramic Capacitor (MLCC). As such, the EPS capacitor 250 includes a body 256 formed with multiple metal layers insulated by corresponding ceramic layers (not illustrated). The EPS capacitor 250 includes a first electrode 252 and a second electrode 254 that may be disposed at opposing ends of the body 256. The electrodes 252 and 254 serve as electrical terminals for charging and discharging the capacitor 250. One electrode serves as the power terminal and the remaining electrode serves as the negative terminal. The following discussion assumes that first electrode 252 is the positive electrode and that second electrode 254 is the negative electrode without loss of generality. However, the polarity may be reversed in other embodiments.

A first metal plate metal plate 224 in the M2 layer 208 is disposed directly on a top surface of positive electrode 252. First metal plate 224 may also be denoted as a power supply metal plate 224. The ground metal plate 220 may extend laterally to cover the entire top surface of positive electrode 252. The power supply metal plate 224 extends laterally away from the positive electrode 252, e.g., extending to the left side of the positive electrode 252 in FIG. 2. The power supply metal plate 224 couples through vias 266 to the M1 metal layer 206, which in turn couples through one or more die interconnects 227 to a head switch 290 in a corresponding die 295. Die interconnects 227 may comprise solder bumps, copper pillars, or other suitable types of interconnects. When head switch 290 is closed, an isolated portion 261 of metal layer M1 is energized to provide a power supply voltage VDD to die 295. Head switch 290 may selectively open to isolate die 295 from the external power supply as coupled from power supply metal plate 224.

A ground metal plate 220 in the M2 metal layer 208 covers a top surface of ground terminal 254 analogously to how power supply metal plate 224 covers positive terminal 252. Ground metal plate 220 also extends laterally from negative electrode 254 such that a footprint for ground metal plate 220 is larger than a footprint for negative electrode 254. Vias 264 couple from a top surface of the ground metal plate 220 to M1 metal layer 206. Vias 264 are a means for connecting the ground metal plate 220 to a ground source. Note that one or more vias 264 are offset from the footprint of ground metal plate 220. Similarly, one or more vias 266 are offset from the footprint of positive terminal 252. Vias 266 are a means for connecting the power supply metal plate 224 to a power source. As such, the portions of the M1 metal layer 206 that overlaps with the footprints of electrodes 252 and 254 may be utilized for other connections rather than being a keep-out area reserved strictly for vias 266 and 264. Further, because of the larger footprints for power supply metal plate 224 and ground metal plate 220, the number of vias 266 and 264 is increased as compared to vias 116 and 118 discussed with regard to conventional package substrate 100. Due to this increased number of vias, the parasitic inductance and resistance for EPS capacitor 150 is reduced.

To couple positive electrode 252 to an external power supply (not illustrated), electrode 252 couples to an additional power supply metal plate 226 in the M3 metal layer 210. Additional power supply metal plate 226 couples through vias 265 to the M4 metal layer 212, which in turn couples to the external power supply through one or more solder balls 267 on a board-facing surface of package substrate 202. Vias 265 are a means for connecting the additional power supply metal plate 226 to a power source. In addition, one or more vias 274 may also couple additional metal power supply metal plate 226 to power supply metal plate 224.

To couple negative electrode 254 to an external ground (not illustrated), negative electrode 254 couples to an additional ground metal plate 222 in M3 metal layer 210. Additional ground metal plate 222 couples through vias 268 to the M4 metal layer 212, which in turn couples to the external ground through one or more solder balls 267. Vias 268 are a means for connecting the additional ground metal plate 222 to a ground source. In addition, one or more vias 272 may also couple additional ground metal plate 222 to ground metal plate 220. Accordingly, capacitor 250 is buried in between the power/ground plates 220, 222, 224 and 226 which may be connected to a plurality of vias at various locations to provide wider current paths to the capacitor 250 in both the vertical and lateral directions. Thus, the interconnect inductance in the package substrate 200 is significantly reduced.

In contrast, the conventional substrate package 100, as shown in FIG. 1, requires that the vias 116 and 118 be positioned within the footprints of electrodes 152 and 154, respectively. Further, the limited number of current paths through the vias 116 and 118 increases the parasitic inductance of EPS capacitor 250. The improved substrate package 200, as shown in FIG. 2, provides laterally extending power/ground plates 220, 222, 224, and 226 to allow vias 262 and 264 to be positioned away from the electrodes 252 and 254 to provide more flexibility in circuit routing. Further, the improved substrate package 200 allows more current paths because the number of vias 265, 266, 264, and 268 is increased as compared to the corresponding number of vias for conventional package substrate 100. Vias 265, 266, 264, and 268 are a means for connecting the metal plates 220, 222, 224, 226 respectively to a power or ground source.

Figure 3:
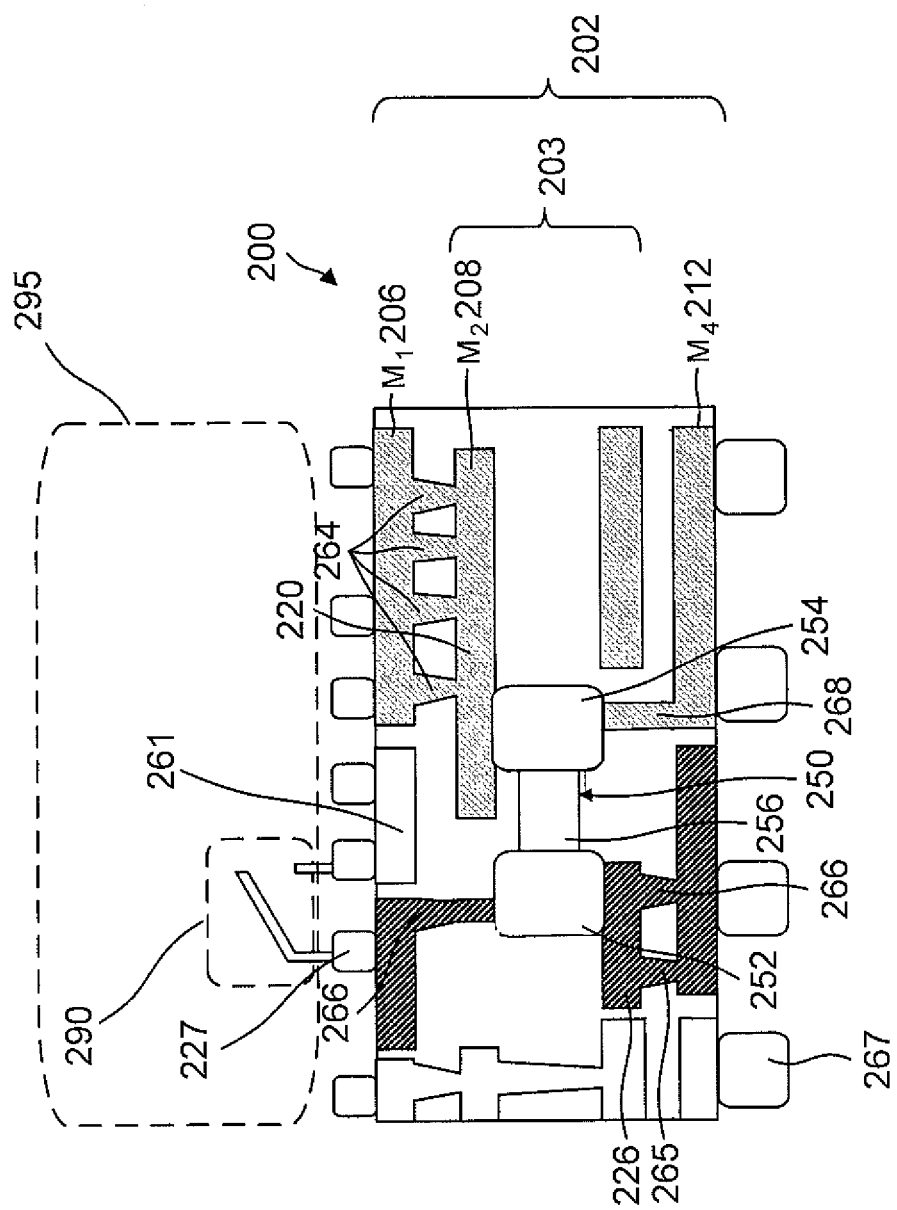
FIG. 3 is a cross-sectional view of a package substrate with an EPS capacitor in accordance with another embodiment of the present disclosure.

FIG. 3 shows an example integrated circuit package 200 according to another embodiment. The integrated circuit package 200 of FIG. 3 may be substantially similar to that of FIG. 2, except that first metal plate 224 is replaced with an extended via 266 and that additional ground metal plate 222 is replaced with an extended via 268. As such, the negative electrode 254 is covered from the top side, e.g., a first side of the core 203, by ground metal plate 220, but is connected to an extended via 268 from the bottom side, e.g., a second side of the core 203. Also, the positive electrode 252 is covered from the bottom side, e.g., the second side, by power supply metal plate 226, but is connected to an extended via 266 from the top side, e.g., the first side. Other variations, such as covering the positive electrode 252 from the top side, e.g., the first side, but not the bottom side, e.g., the second side, and/or covering the ground electrode 254 from the bottom side, e.g., the second side, but not from the top side, e.g., the first side, also may be implemented. These different variations may provide different spatial arrangements for the package substrate 100 to accommodate different components as needed. Further, these different variations may result in different reductions in parasitic inductance.

Having described a package substrate structure, a sequence and methods for manufacturing/providing package substrate structures will now be described below.

Exemplary Sequence for Manufacturing a Package Substrate

FIGS. 4A-4I illustrate a sequence for manufacturing a package substrate 400 with an embedded capacitor. In some implementations, the sequence of FIGS. 4A-4I may be used to manufacture the package substrate 200 of FIGS. 2 and 3B. However, the sequence of FIGS. 4A-4I may be applicable to other package substrates.

In FIG. 4A, the package substrate starts with a core substrate 402, such as a silicon substrate in some implementations. Different implementations may use different substrates. A hole or cavity 404 may be formed in the core substrate 402. The hole or cavity 404 may be of a size or shape for accommodating a capacitor. In particular, the hole or cavity 404 is formed through the core substrate 402.

In FIG. 4B, an adhesive tape 406 is applied on a bottom side of the core substrate 402. The adhesive strength of the tape 406 to the bottom surface of the core substrate 402 is greater than a weight of a capacitor, such that the capacitor may be supported by the adhesive tape 406. In FIG. 4C, a capacitor 408 is inserted into the cavity 404. The capacitor 408 may be orientated such that the two terminal electrodes of the capacitor 408 align in a lateral direction. The adhesive tape 406 may support and hold the capacitor 408 in position inside the cavity 404.

Figure 4D:
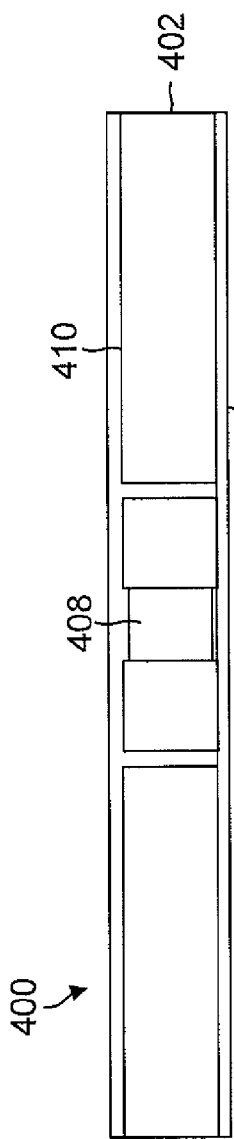
Figure 4E:
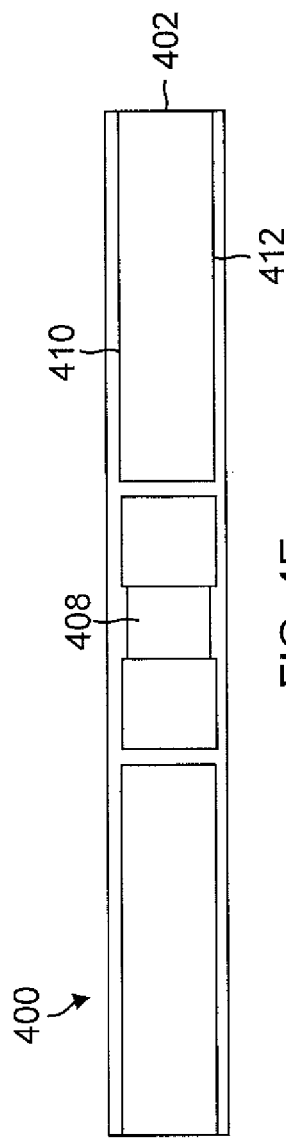

In FIG. 4D, a dielectric lamination layer is applied to the top side of the core substrate 402. In particular, the dielectric lamination layer is deposited onto the top surface of the core substrate 402. Further, the dielectric lamination also fills into the cavity 404 to hold the capacitor 408 in the cavity 404. In FIG. 4E, the adhesive tape 406 is removed from the bottom side of the core substrate 402. The capacitor 408 continues to be held in place by the dielectric lamination filled inside the cavity 404. After the adhesive tape 406 is removed, a dielectric lamination layer 412 is applied to the bottom side of the core substrate 402.

Figure 4F:
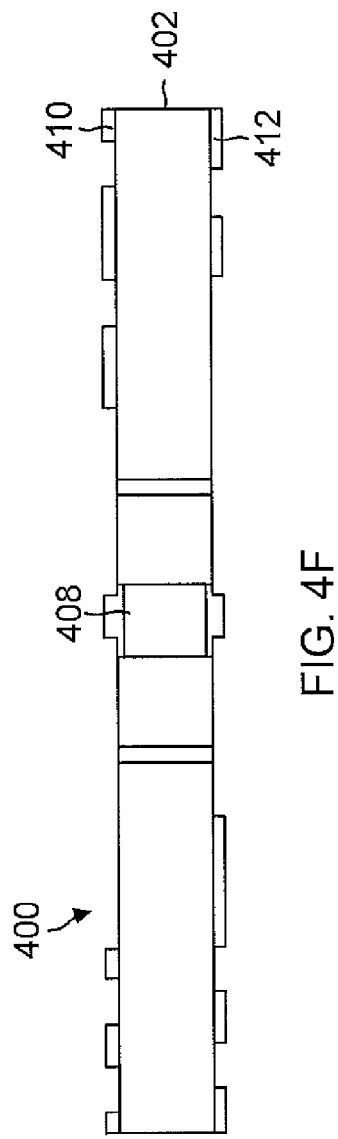

In FIG. 4F, patterns are formed in the dielectric lamination layers 410 and 412. The patterns may be cavities and/or trenches in the dielectric lamination layers 410 and 412. For example, the patterns may define laterally extending power/ground plates that cover the capacitor 408. Different implementations may use different methods for creating/forming the patterns 405. In some implementations, the patterns are etched/drilled in the dielectric lamination layers 410 and 412. For example, a laser may be used to etch and/or drill in the dielectric lamination layers 410 and 412. In some implementations, lithography is used to etch the patterns in the dielectric lamination layers 410 and 412. The etching may also be performed by a chemical process in some implementations.

Figure 4G:
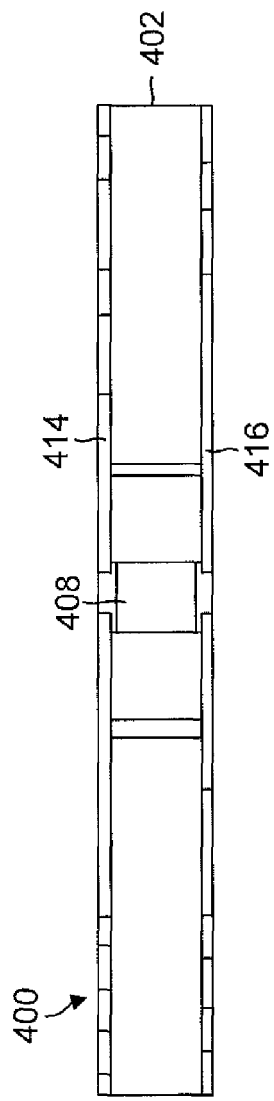

In FIG. 4G, power/ground plates 414 and 416 are deposited above and below the core substrate 402, e.g., from a first and a second side of the core substrate 402. The power/ground plates 414 and 416 may fill some or all of the patterns created in the dielectric lamination layers 410 and 412. Different implementations may use different materials for the power/ground plates 414 and 416. For example, the power/ground metal plates 414 and 416 may be copper in some implementations.

Figure 4H:
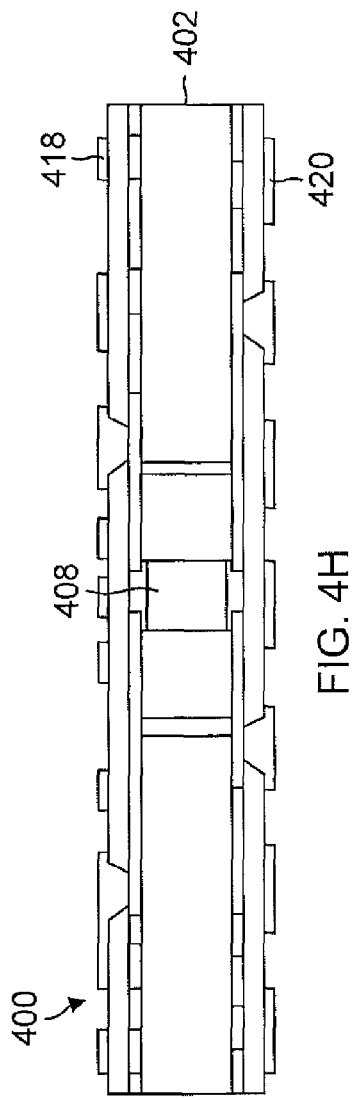
Figure 4I:
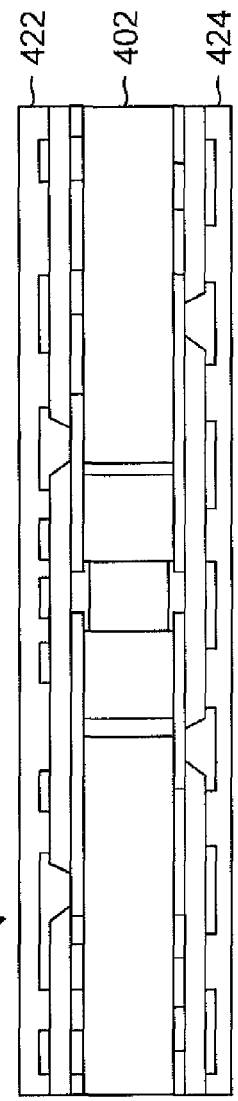

In FIG. 4H, additional dielectric lamination layers 418 and 420 are applied on the top and the bottom side of the core substrate 402. Patterns are formed in these dielectric lamination layers 418 and 420. The patterns may define vias and other connections. For example, a plurality of vias may be formed to connect to the power/ground metal plates 414 and 416. In FIG. 4I, metal layers 422 and 424 are deposited above and below the core substrate 402. The metal layers 422 may form vias or other connections based on the patterns formed in the dielectric lamination layers 418 and 420.

Exemplary Method for Manufacturing a Package Substrate

Figure 5:
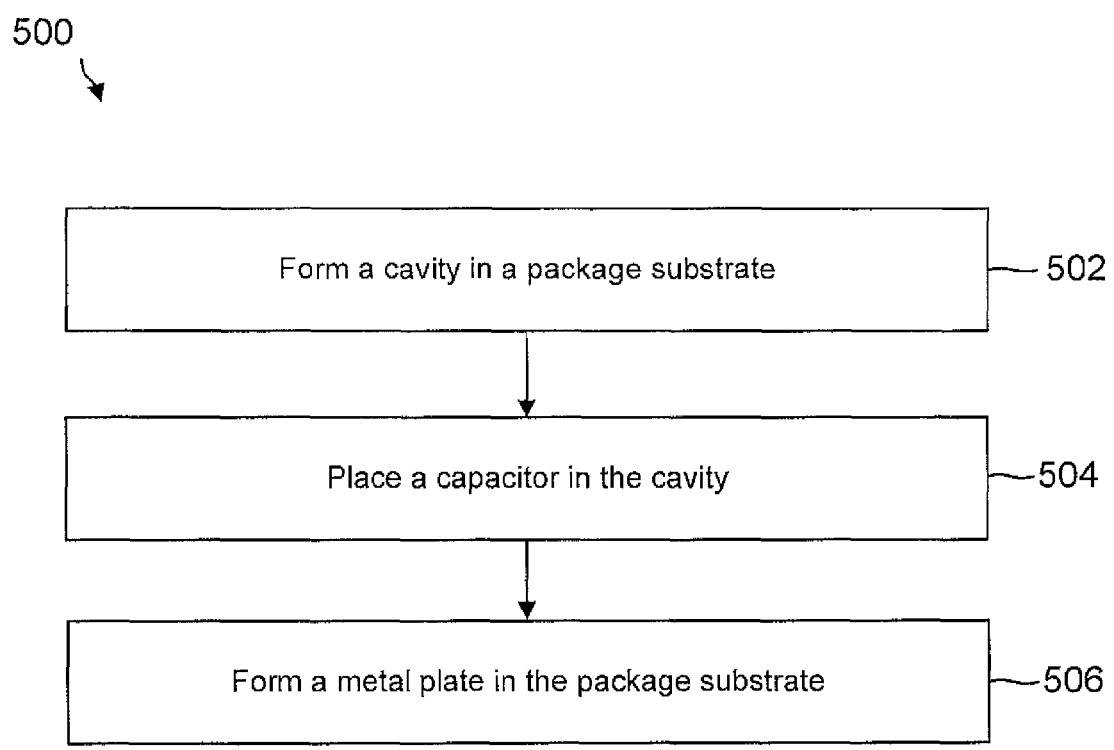
FIG. 5 is a flowchart for a method of manufacture for a package substrate embedded with an EPS capacitor in accordance with an embodiment of the present disclosure.

FIG. 5 illustrates a flow diagram of a method for manufacturing a package substrate with an embedded EPS capacitor. In some implementations, the method of FIG. 5 is used to manufacture/provide the package substrate 200 of FIGS. 2 and 3B and the package substrate 400 of FIGS. 4A-4I.

The method provides (at 502) a substrate (e.g., core substrate 402). The substrate may be a silicon substrate in some implementations. Different implementations may use different substrates. A hole or cavity 404 is formed in the core substrate 402. The hole or cavity 404 is formed through the core substrate 402. This step is illustrated in FIG. 4A.

An adhesive tape 406 is applied on a bottom side of the core substrate 402. An example of this step is shown in FIG. 4B. At step 504, a capacitor is inserted into the cavity 404. The capacitor 408 may be orientated such that the two terminal electrodes of the capacitor 408 align in a lateral direction. This step is illustrated in FIG. 4C.

A dielectric lamination layer is applied to the top side of the core substrate 402. The cavity 404 also is filled with the dielectric lamination. Further, the adhesive tape 406 is removed from the bottom side of the core substrate 402 and a dielectric lamination layer 412 is applied to the bottom side of the core substrate 402. This step is illustrated in FIGS. 4D and 4E.

Patterns are formed in the dielectric lamination layers 410 and 412. The patterns may be cavities and/or trenches in the dielectric lamination layers 410 and 412. For example, a laser may be used to etch and/or drill in the dielectric lamination layers 410 and 412. In some implementations, lithography is used to etch the patterns in the dielectric lamination layers 410 and 412. The etching may also be performed by a chemical process in some implementations. An example of this step is illustrated in FIG. 4F.

At step 506, power/ground plates 414 and 416 are deposited above and below the core substrate 402. The power/ground plates 414 and 416 may fill some or all of the patterns created in the dielectric lamination layers 410 and 412. This step is illustrated in FIG. 4G. Additional connections or layers then may be added to the packet substrate. For example, additional dielectric lamination layers 418 and 420 are applied on the top and the bottom side of the core substrate 402. Patterns are formed in these dielectric lamination layers 418 and 420. Metal layers 422 and 424 are deposited above and below the core substrate 402. The metal layers 422 may form vias or other connections based on the patterns formed in the dielectric lamination layers 418 and 420. This step is illustrated in FIGS. 4H and 4I.

Exemplary Electronic Devices

Figure 6:
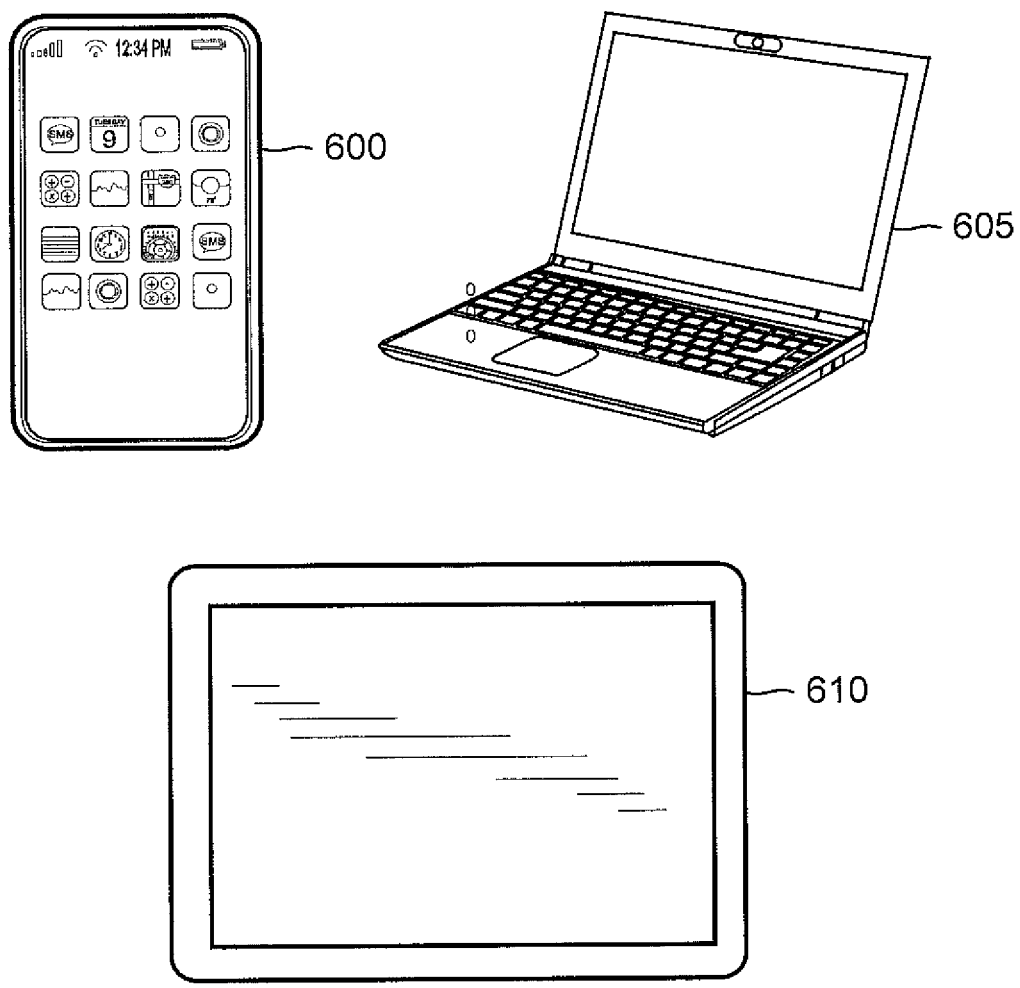
FIG. 6 illustrates some example electronic systems incorporating a package substrate in accordance with an embodiment of the disclosure.

FIG. 6 illustrates various electronic devices that may be integrated with any of the aforementioned integrated circuit, die or package. For example, a mobile telephone 600, a laptop computer 605, and a tablet PC 610 may include an integrated circuit (IC) 1100 as described herein. The IC 1100 may be, for example, any of the integrated circuit package incorporating a package substrate constructed in accordance with the disclosure. Other electronic devices that may be configured with the integrated circuit packages constructed in accordance with the disclosure may include a music player, a video player, a communication device, a hand-held personal communication systems (PCS) units, portable data units such as personal digital assistants, GPS enabled devices, navigation devices, set top boxes, entertainment units, fixed location data units such as meter reading equipment, communications devices, smartphones, or any other device that stores or retrieves data or computer instructions, or any combination thereof.

One or more of the components, steps, features and/or functions illustrated in the Figs may be rearranged and/or combined into a single component, step, feature or function or embodied in several components, steps, or functions.

Additional elements, components, steps, and/or functions may also be added without departing from novel features disclosed herein. The apparatus, devices, and/or components illustrated in the Figs may be configured to perform one or more of the methods, features, or steps described in the Figs. The novel algorithms described herein may also be efficiently implemented in software and/or embedded in hardware.

The various features of the embodiments described herein can be implemented in different systems without departing from the embodiments disclosed. It should be noted that the foregoing aspects of the disclosure are merely examples and are not to be construed as limiting the embodiments disclosed. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package substrate, comprising:
   a substrate comprising a first side;
   a capacitor embedded in the substrate, wherein the capacitor comprises a first electrode and a second electrode;
   a first metal plate extending laterally in the substrate, wherein the first metal plate is disposed directly on the first electrode of the capacitor and extends laterally from a first side of the first electrode; and
   a plurality of vias including a first via extending perpendicular to the first metal plate and connected to the first metal plate from the first side of the substrate.

2. The package substrate of claim 1, wherein the first via is offset from an area of the first metal plate overlapping the first electrode of the capacitor.

3. The package substrate of claim 1, further comprising a second metal plate extending laterally in the substrate, wherein the second metal plate is disposed on and covers the first electrode of the capacitor from a second side of the substrate opposite from the first side of the substrate.

4. The package substrate of claim 3, wherein the first metal plate and the second metal plate are connected by a second via extending in the substrate between the first and second metal plates.

5. The package substrate of claim 1, wherein the first via is configured to supply a positive voltage to the capacitor via the first metal plate.

6. The package substrate of claim 1, wherein the capacitor comprises a Multi-Layer Ceramic Capacitor (MLCC).

7. The package substrate of claim 1, further comprising a third metal plate extending laterally in the substrate, wherein the third metal plate is disposed directly on and covers the second electrode of the capacitor from a second side of the substrate opposite to the first side of the substrate.

8. The package substrate of claim 7, further comprising a plurality of vias connected to the third metal plate from the second side of the substrate.

9. The package substrate of claim 7, further comprising a fourth metal plate extending laterally in the substrate, wherein the fourth metal plate is disposed directly on and covers the second electrode of the capacitor from the first side of the substrate.

10. The package substrate of claim 9, wherein the third metal plate and the fourth metal plate are connected by a third via extending in the substrate between the third and fourth metal plates.

11. The package substrate of claim 1, wherein the package substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

12. A device, comprising:
    a substrate comprising a first side;
    a capacitor embedded in the substrate, the capacitor comprises a first electrode and a second electrode;
    a first metal plate extending laterally in the substrate and disposed directly on the first electrode of the capacitor from the first side of the substrate; and
    a plurality of means for connecting the first metal plate to a power or ground source and extending perpendicular to the first metal plate and connected to the first metal plate from the first side of the substrate.

13. The device of claim 12, wherein at least one of the plurality of means for connecting to the power or ground source is offset from an area of the first metal plate covering the first electrode of the capacitor.

14. The device of claim 12, further comprising a second metal plate extending laterally in the substrate and disposed directly on and covering the second electrode of the capacitor from a second side of the substrate opposite from the first side.

* * * * *